United States Patent [19]

Bard et al.

[11] Patent Number: 5,063,951
[45] Date of Patent: Nov. 12, 1991

[54] FLUID TREATMENT DEVICE

[75] Inventors: Steven L. Bard, Endwell; David N. Christensen, Johnson City, both of N.Y.; John J. Glenning, Montrose, Pa.; James A. Nicoletti; Mark W. Urdanick, both of Endicott, N.Y.

[73] Assignee: International Business Machines Corporation, Armonk, N.Y.

[21] Appl. No.: 554,487

[22] Filed: Jul. 19, 1990

[51] Int. Cl.⁵ .............................................. B08B 3/08
[52] U.S. Cl. .................... 134/64 R; 15/302; 118/63; 118/411
[58] Field of Search ............... 134/64 R, 64 P, 122 R, 134/122 P, 199; 68/5 E, 6, 181 R; 15/302, 306.1, 309.1, 309.2; 118/63, 410, 411

[56] References Cited

U.S. PATENT DOCUMENTS

| | | | |
|---|---|---|---|
| 2,879,779 | 3/1959 | Delafontaine | 15/302 X |
| 3,044,098 | 7/1962 | Stalson | 15/302 |
| 3,137,882 | 6/1964 | Blanchard | 134/122 X |
| 3,196,832 | 7/1965 | Zin | 118/63 X |
| 3,734,109 | 5/1973 | Hebner | 134/64 X |
| 4,137,988 | 2/1979 | Croix-Marie | 15/302 X |
| 4,174,261 | 11/1979 | Pellegrino | 204/273 |
| 4,270,317 | 6/1981 | Kurie | 134/64 X |

FOREIGN PATENT DOCUMENTS

| | | | |
|---|---|---|---|
| 2453927 | 12/1980 | France | 68/5 E |
| 6006 | 2/1974 | Japan | 68/5 E |

Primary Examiner—Philip R. Coe
Attorney, Agent, or Firm—Lawrence R. Fraley

[57] ABSTRACT

A device for applying fluid (e.g., etchant) to a substrate (e.g., thin metallic tape) wherein the device includes a head member having means therein for directing a first fluid (e.g., etchant) at an established first pressure against the substrate and means for directing a second fluid (e.g., air) at an established second pressure equal to or greater than the first pressure (at the location of fluid intersection) and against the substrate in the area proximate the first fluid so as to substantially contain and limit the first fluid to impingement substantially only at the location against which the first fluid is designed to strike. Preferably, two opposing head members are utilized, and these may serve to maintain the substrate therebetween in a suspended state. Both head members are movable relative to each other during fluid application. As stated, the device is particularly suited to function as an etcher, but may also serve other purposes (e.g., coating, cleaning, rinsing, etc.).

17 Claims, 5 Drawing Sheets

FLUID TREATMENT DEVICE

TECHNICAL FIELD

This invention relates to fluid treatment devices and particularly to such devices for treating substrates or the like. As will be defined herein, the device of the instant invention is particularly adapted for etching metallic substrates or the like.

BACKGROUND OF THE INVENTION

Various devices designed for treatment of substrates and similar articles are known in the art, with examples being shown and described in U.S. Pat. No. 4,142,010 (D. J. Pipkin et al), U.S. Pat. No. 4,152,153 (J. M. Jackson et al), U.S. Pat. No. 4,299,186 (D. J. Pipkin et al), U.S. Pat. No. 4,387,124 (D. J. Pipkin), and U.S. Pat. No. 4,836,133 (A. Wohrle). See also pages 1362 and 1363 of the IBM Technical Disclosure Bulletin, Vol. 23, No. 4, September, 1980 (M. Gagne). Various devices as shown and described in these publications are capable of providing several different forms of treatment for the article being so treated, including, for example, coating, cleaning and chemically reacting (e.g., etching) with said article. Accordingly, by the term treatment as used herein to describe the capability of the invention is meant to include the aforementioned functions (coating, cleaning and chemically reacting), as well as others (including, e.g., plating) discernible from the teachings herein. Further, by the term fluid as used herein is meant to include both liquids (e.g., etchants) and gases (e.g., air). As will be defined, the device of the instant invention is particularly adapted for etching relatively thin metallic substrates. However, the invention is not limited to this particular application, as it can be readily used in the above, other applications as well.

As defined herein, the present invention is designed for applying fluid to a substrate in such a manner so as to direct such fluid substantially only to a predetermined, precisely defined location on the substrate. The invention utilizes a head member wherein two fluids are directed such that one functions to substantially limit the impingement of the other to the defined, predetermined location. The invention thus utilizes two fluids at two pressures to provide relatively precise fluid application. The invention, as understood from the following description, operates in a relatively simple manner and, additionally, is relatively inexpensive to manufacture.

It is believed that a fluid treatment device possessing the advantageous features cited herein and otherwise discernible from the teachings provided below would constitute a significant advancement in the art.

DISCLOSURE OF THE INVENTION

It is, therefore, a primary object of the present invention to enhance the art of fluid treatment devices.

It is another object of the invention to provide a fluid treatment device capable of applying fluids to a substrate with relative precision and in a facile manner.

It is still another object of the invention to provide such a device which operates in a relatively simplistic manner and which can be produced relatively inexpensively.

In accordance with one aspect of the invention, there is defined a device for applying fluid to a substrate, the device including at least one head member which includes therein means for directing a first fluid at an established first pressure against the substrate and means for directing a second fluid at an established second pressure (at the location of fluid intersection) against the substrate such that the first fluid impingement on the substrate is limited to a predetermined location.

BEST MODE FOR CARRYING OUT THE INVENTION

Figure 1:
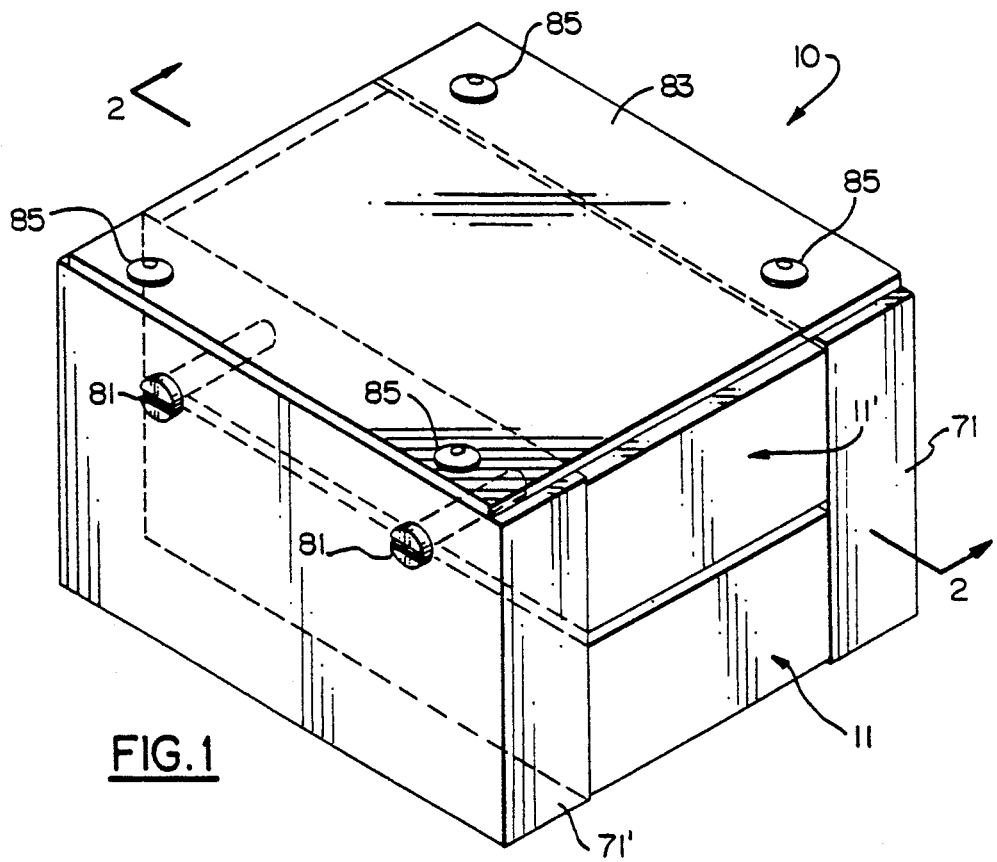
FIG. 1 is a perspective view of a fluid treatment device in accordance with one aspect of the invention.

For a better understanding of the present invention, together with other and further objects, advantages and capabilities thereof, reference is made to the following disclosure and appended claims in connection with the above described drawings.

In FIGS. 1-5, there is shown a fluid treatment device 10 in accordance with a preferred embodiment of the invention. As understood from the following, the invention is capable of applying fluids to a product (such as a substrate surface) while effecting relatively high mass transfer rates to a desired area thereon and while substantially limiting the interaction with the device's external atmosphere. Most significantly, the device as taught herein insures relatively precise impingement of the fluid to a selected area of the substrate, such precision deemed essential in the manufacture of various products such as microcircuits for electronic packages. Accordingly, the invention as defined herein is particularly adapted for use in such manufacture and particularly wherein such manufacture involves the use of etchants or the like as the primary treatment fluid. The invention is not limited to this usage, however, in that other fluids (and associated processes) may be readily accomplished using the instant invention. By way of example, device 10 may be used to rinse various substrates (e.g., metallic lead frames), to remove various materials (e.g., photoresists) found on such substrates using known fluids to accomplish this (e.g., caustic solutions such as sodium hydroxide and potassium hydroxide) and as further defined below, even to perform additive processes (e.g., plating) by relatively minor modification to the invention. This invention is thus considered to represent a significant advancement in the art of fluid treatment devices.

Device 10 comprises at least one head member 11 which includes therein means 13 for directing a first fluid 15 (represented by the solid arrows in FIG. 2) of an established first pressure against a first, predetermined location 17 located on a substrate 19 positioned within device 10. In one embodiment of the invention, first fluid 15 was an etchant (cupric chloride) and was applied against a location 17 on a substantially metallic (copper) substrate 19. In one example, substrate 19 included additional material (e.g., polymer) thereon and an additional conductive layer over this polymer. The purpose of the etchant was to remove protected portions of such a conductive layer, substrate 19 subsequently being used as a microcircuit structure. Further examples of such conductive material are represented by the numeral 21 in FIG. 3, the insulative polymer not being shown.

As stated, device 10 is capable of treating other types of substrate material, including non-metallic, if desired. The invention is thus not limited to the particular type of substrate depicted herein.

Figure 2:
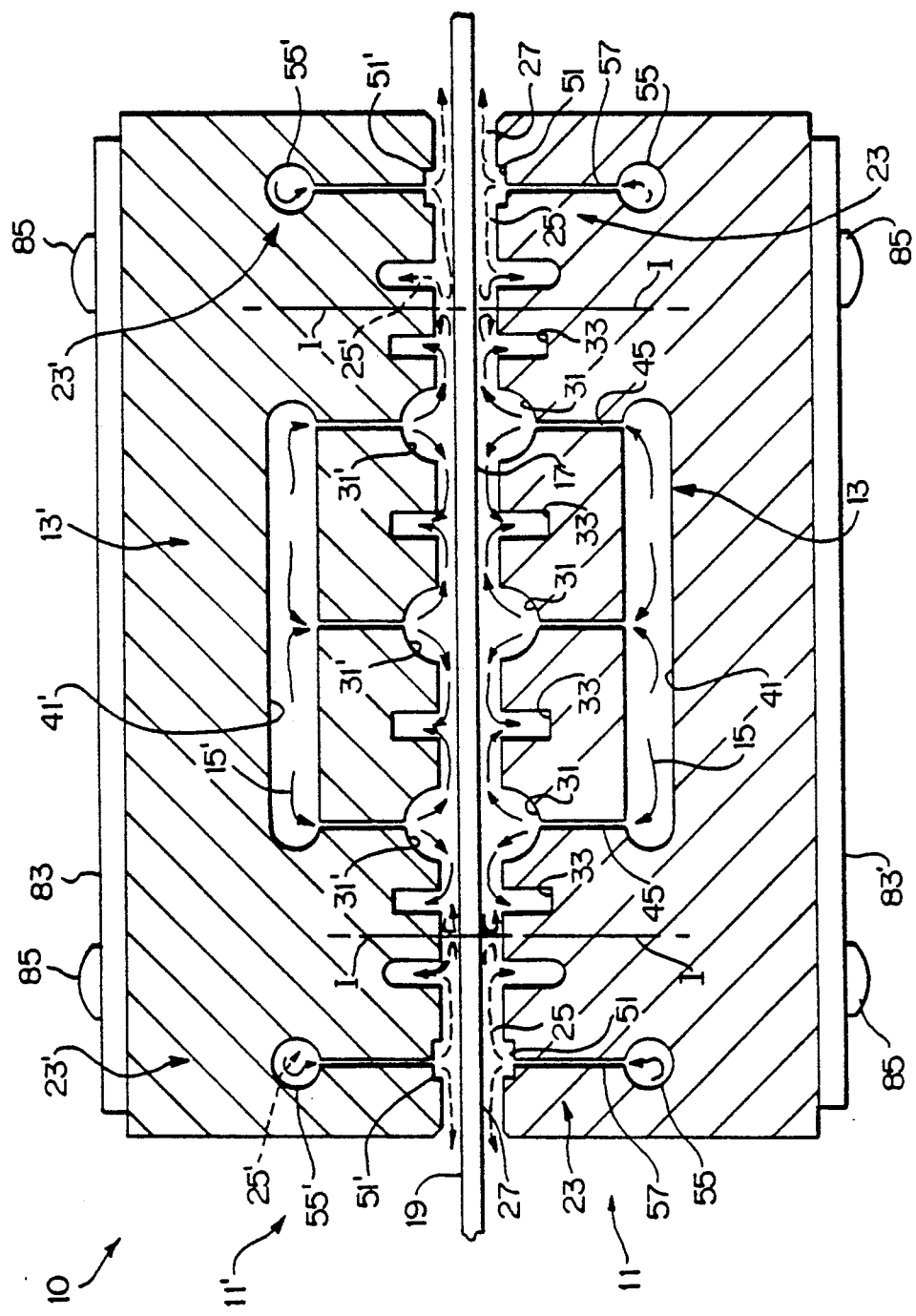
FIG. 2 is a side, elevational view, partly in section, of the fluid treatment device of FIG. 1 as taken along the line 2—2 in FIG. 1.

In the above example, the metallic substrate 19 possessed an overall width (dimension W in FIG. 3) of about 2.73 inches and a thickness (dimension T in FIG. 3) of only about 0.020 inch. Substrates having thicknesses ranging from 0.005 inch to about 0.150 inch may be successfully treated using the invention. In addition, substrates having widths as large as 7 inches and 21 inches have been treated. As shown in FIG. 2, head member 11 further includes means 23 for directing a second fluid 25 (represented by the dashed arrows in FIG. 2) of an established second pressure substantially equal to or greater than the pressure of first fluid 15, this second fluid 23 being directed to a predetermined location 27 on substrate 19 adjacent the first location 17 which receives application of fluid 15. As seen in FIG. 2, the means for applying second fluid 25 directs this fluid at opposite ends of the substrate's first location. Such application of the second fluid thus serves to substantially limit application of first fluid 15 to impingement substantially only on location 17, and at the approximate central area of device 10.

In one example of the invention (that using the aforementioned etchant solution), air was the preferred fluid for second fluid 25. As stated, the second fluid is at a pressure equal to or greater than the first fluid pressure to thus assure impingement of the first fluid to the desired location. In the above example wherein etchant and air were utilized as the fluids, the etchant was established at a supply pressure within the range of from about three to about seven pounds per square inch (PSI) while the air supply pressure was within a range of from about three PSI to about fifteen PSI. Volume flow rates for the etchant ranged from about six to about ten gallons per minute (GPM). In another example, wherein device 10 was used to provide a rinsing function, deionized water was utilized as first fluid 15 and supplied at a pressure within the range of from about one to about two PSI, while the second fluid (again air), was supplied at a pressure of from about one to about five PSI. Volume flow rates for the water were within the range of from about two to about four GPM. Device 10 is capable of treating substrates located therein wherein the substrate is either moving at an established rate or established in a fixed position relative to the device's structure. In the situation wherein substrate 19 is moving, first fluid 15 will strike the surface adjacent head 11 substantially along the entirety thereof. However, the invention assures that such fluid application will only occur for a predetermined time to the location (17) illustrated in FIG. 2, thus assuring that the desired time periods for exposure to the particular fluids being applied will occur. Such time periods may of course be readily adjusted by corresponding adjustment to the substrate's rate of movement.

Preferably, device 10 includes two head members, the second head member being represented by the numeral 11' in the drawings. Further, head 11' may be of identical configuration to that of the lower head 11 shown in FIG. 2. Thus, similar numerals will be used to identify similar structures. However, this is not to limit the invention, in that this second head may be of a different internal configuration while still achieving the purpose desired, that being to provide two fluids to provide precise fluid impingement is also provided by the lower head member (11). This second head member also includes means 13' and 23' substantially identical to means 13 and 23 for head 11. This arrangement (two opposing similar head members) is particularly desired if similar treatments to both sides of the common substrate are desired. The invention is of course not limited to this arrangement in that different treatments (e.g., etching and rinsing) may be applied to the opposite sides of the common substrate. In the event that substrate 19 is of relatively porous configuration (having apertures or the like therethrough), utilization of two similar and opposed head members may still be preferred. In such an arrangement, the numerals 15' and 25' are shown to represent the first and second fluids respectively.

When two opposing head members are used for device 10, it is possible to maintain the substrate at a spaced location (as shown in FIG. 2) from the opposed head members during fluid application. Should only one such head member be used, the substrate will also be located above at a predescribed distance, depending on the fluid pressures utilized. It is understood that both fluids from each head member apply sufficient pressure against the substrate so as to maintain it at such a spaced location.

In the above example, wherein the aforementioned etchant and air supply pressures were utilized to treat a substantially solid substrate having the above dimensions, the substrate was maintained at a distance of from about 0.003 to about 0.015 inch from the adjacent planar surfaces of each respective head member.

Figure 3:
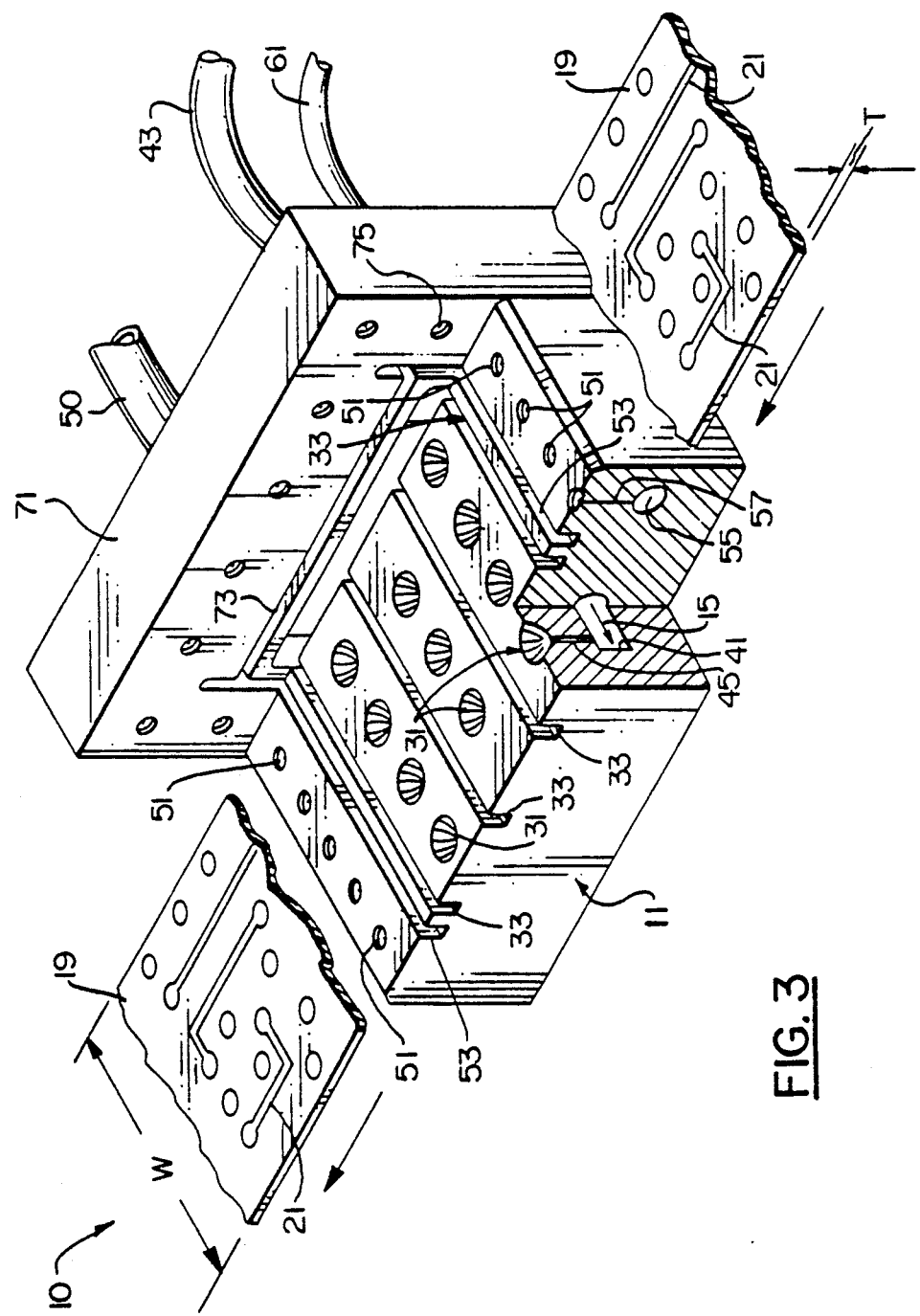
FIG. 3 is a perspective view, on a slightly reduced scale, of the fluid treatment device of FIG. 1, illustrating only one of the possible head members for use therein.

Means 13 for directing first fluid 15 comprises at least one inlet port 31 positioned within head member 11 and at least one outlet port 33 located relative to the inlet port. As seen in FIGS. 2 and 3, means 13 includes a plurality (e.g., eleven) of such inlet ports 31 located in three individual rows along the external (upper) surface of head member 11. As further seen in FIGS. 1 and 3, each of these inlet ports for means 13 includes curvilinear side walls, said configurations deemed most appropriate for effective flow of fluids such as etchants or the like in order to direct said fluids onto the adjacent substrate in the most effective manner. Significantly, the respective outlet ports 33 number only four, each one being located adjacent and with respect to a singular row of inlet ports 33. As seen in FIGS. 2 and 3, each outlet port is of a elongated configuration and thus constitutes a groove or slot within the head member's upper surface. It has also been determined that linear (straight) sidewalls for these outlet ports provide the most effective means of fluid escape at this location, although these sidewalls may possess other configurations (e.g., curvilinear, tapered) and still provide effective fluid escape.

The first fluid 15 is preferably supplied to a common chamber 41 located in the head member from a common inlet tube 43 or the like connected to this common chamber. Fluid 15 is further passed through narrow passages 45 between the ports and common chamber to each of the respective curvilinear inlet ports. Withdrawal of fluid 15 after application to substrate 19 is accomplished by passage of this fluid through the elongated grooves 33 which are preferably connected to a common duct (not shown) or the like whereupon these pass through an outlet tube 50 or the like. Tube 50 may in turn be connected to a recirculation means (e.g., a pump) which returns the fluid to device 10. It is of course also possible to provide appropriate fluid treatment elements (e.g., filters) as part of this recirculation means.

It is understood that when two head members are utilized, the corresponding inlet and outlet ports for the remaining head member (e.g., 11') will be similarly connected to common inlet and outlet tubing, such as 43 and 51 shown in FIG. 3. It is also within the scope of the invention to connect the common chambers 41 and 41' for both head members to a singular common inlet 43, as well as commonly connect the outlet grooves for both head members to exit tubing 50.

As stated, fluid treatment device 10 maintains the treated substrate at the above cited spaced location from the respective head members during fluid application. This relatively narrow gap thus formed between product and head member, coupled with the fluid rates of flow as defined, in turn thus results in relatively high mass transfer and chemical processing rates for the invention. Understandably, the invention is thus readily adaptable to mass production techniques. Significantly, the device as described above also assures capture of the first fluids as utilized herein to thus enable recycling thereof if desired. Such recapture serves to reduce the cost of manufacture associated with using the invention. Equally significant, because the respective second fluids serve to assist in such capture, any potentially harmful materials (e.g., pollutants) are thus contained within the system.

It is understood that the maintaining of substrate 19 at the spaced distance from the head member's external surface results in a fluid bearing being formed along the surface, the substrate thus riding on said bearing during location within (including movement through) device 10 during fluid application.

Each of the means 23 for directing second fluid 25 comprises at least one inlet port 51 and a corresponding outlet port 53 located relative thereto. As shown in FIGS. 2 and 3, a plurality (e.g., ten) of such inlet ports 51 are utilized for each head member, these inlet ports being arranged in two singular rows of five each (FIG. 3). The second fluid 25 is supplied to each of these rows of inlet ports through a common channel 55 (or 55' in the case of head member 11'), which fluid then passes upwardly within the head member through narrow passages 57 to the respective inlet ports. Each inlet port, as shown, includes substantially linear (straight) sidewalls, as do each of the corresponding outlet ports 53. As shown in FIG. 3, these outlet ports are preferably in the shape of an elongated channel of substantially similar configuration (excluding the lower surface thereof) to the adjacent outlet ports 33 for means 13. Thus, a total of only two such outlet ports 53 (or channels) for the second means 23 is provided within each head member. Each of the common inlet chambers 55 is in turn coupled to a common inlet tube 61 (FIG. 2), which tube is in turn connected to the suitable source (e.g., pump). Each of the outlet channels 53 are in turn preferably connected to a exhaust tube (not shown) or the like in order to achieve effective venting of the second fluid (air).

As shown in FIG. 2, the locations of intersection between the respective first and second fluids (represented by the lines I—I in FIG. 2) represent the external periphery for the first location to which the first fluid is applied to substrate 19. When using the fluids, pressures and port configurations cited above, the resulting fluid impingement along these intersection boundaries was of extremely fine resolution. That is, the line of demarcation between both fluids is clearly and precisely defined. Such precision is considered essential in the manufacture of structures such as microcircuits and represents one of the highly advantageous features of the invention. As also shown in FIG. 3, device 10 further includes a common manifold 71 located adjacent the respective head members for assisting in receiving and withdrawing the fluids used in device 10. Common manifold 71 preferably includes a common, longitudinal groove 73 or the like to interconnect the described outlet ports 53. Additionally, the common manifold 71 further includes a plurality of inlet ports 75 which are in turn coupled to the respective head member (particularly to the common inlet chambers 55 thereof). Although only one such manifold 71 is depicted in FIG. 3, it is understood that additional manifold members may be utilized in the invention to assist in fluid intake and withdrawal. In FIG. 1, for example, a second manifold 71' is shown, which second manifold may in turn be coupled to either or both of the respective head members 11 and 11'. The tubing associated with such common manifolds is not shown in FIG. 1.

Figure 4:
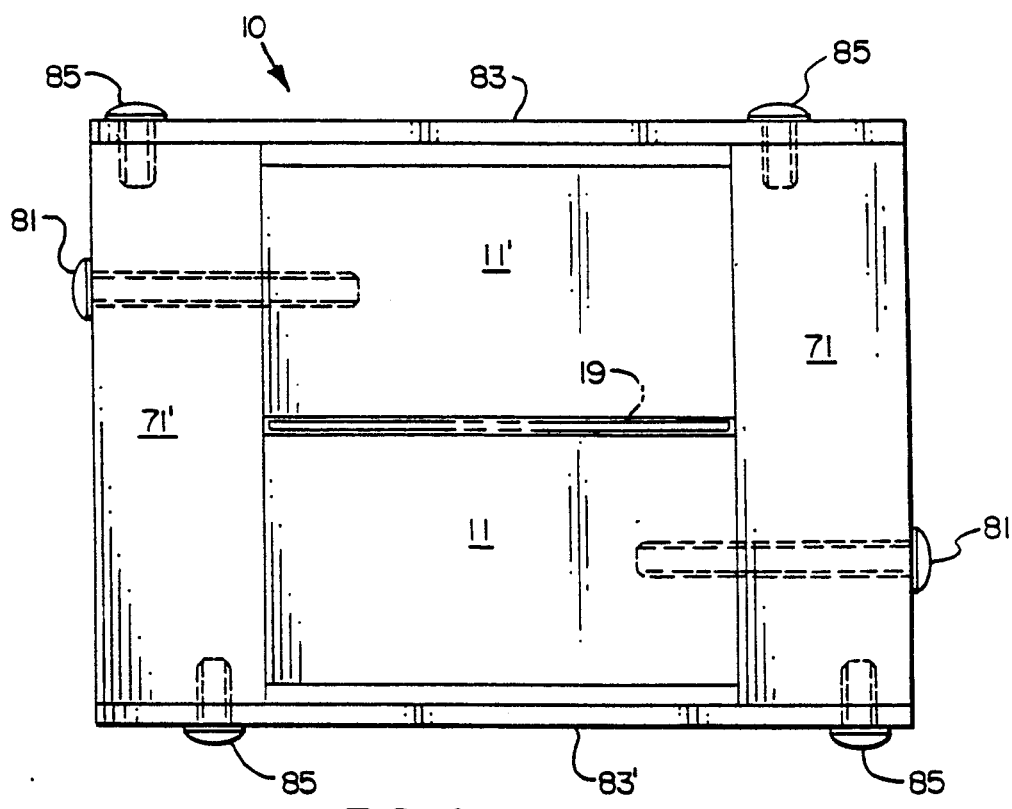
FIG. 4 is a front, elevational view on a slightly enlarged scale, illustrating the relative positioning between the head members of the invention during initial positioning of the substrate being treated therein.
Figure 5:
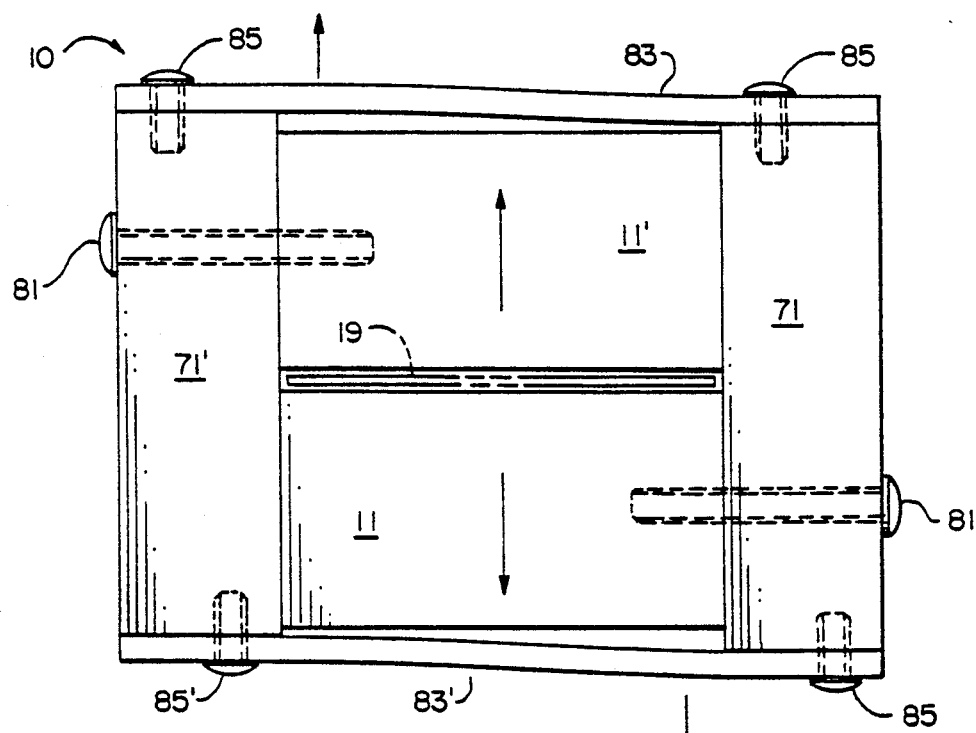
FIG. 5 is a front elevational view, substantially similar to the front elevational view in FIG. 4, illustrating the relative positioning of the head members of the invention during fluid application.

In FIGS. 4 and 5, a relative displacement of the two opposed head members 11 and 11' can be seen. In FIG. 4, each of the head members is shown in its original position prior to fluid application. Substrate 19 (indicated in phantom) is shown between both head members. Although a slight spacing is indicated in FIG. 4, it is understood that the substrate may in fact contact both of the adjacent external head surfaces prior to fluid application. As further shown in FIG. 4, each of the head members is connected (e.g., using screws 81) to a respective one of the adjacent manifold (side support) members 71 and 71'. A minimum of two such screws 81 is used for each respective head member and manifold subassembly (see FIG. 1). Each of these side manifold (side support) members is in turn mechanically connected to the other, opposing manifold member by a pair of bendable plate members 83 and 83'. Screws 85 (four per plate) are used to connect the plates to the upper and lower surfaces of each manifold member.

Thus it can be seen in FIG. 5 that when fluid is applied (e.g., at the pressures cited above), relative movement of both head members 11 and 11' will occur. In FIG. 5, head member 11 moves downwardly while head member 11' moves upwardly relative to the common substrate, which substrate is now located at the aforementioned spaced location from each of the respective head members. It is noted that each of the head members maintains its fixed position relative to the manifold connected thereto, but each such head member is able to move in the opposing manner as shown by virtue of the respective plate members 83 and 83' slightly deflecting (bending) in the manner indicated in FIG. 5. In a preferred embodiment of the invention, each of the head members was comprised of polycarbonate (e.g., Lexan), as was the adjacent manifold members 71 and 71'. Lexan is a registered trademark of the General Electric Company. Further, the interconnecting plate members 83 and 83' were also comprised of this material. It is within the scope of the invention to utilize other materials for these elements, including polyvinyl chloride, stainless steel, aluminum and ceramic, depending on the fluids used. Lexan is preferred, as this material is available in transparent form, thereby enabling visual monitoring of the treatments performed by the invention through the walls of the assembly. Another material successfully used is Delrin (a trademark of E. I. duPont deNemours Company), said material particularly desirable when passing solvents through the invention.

Figure 6:
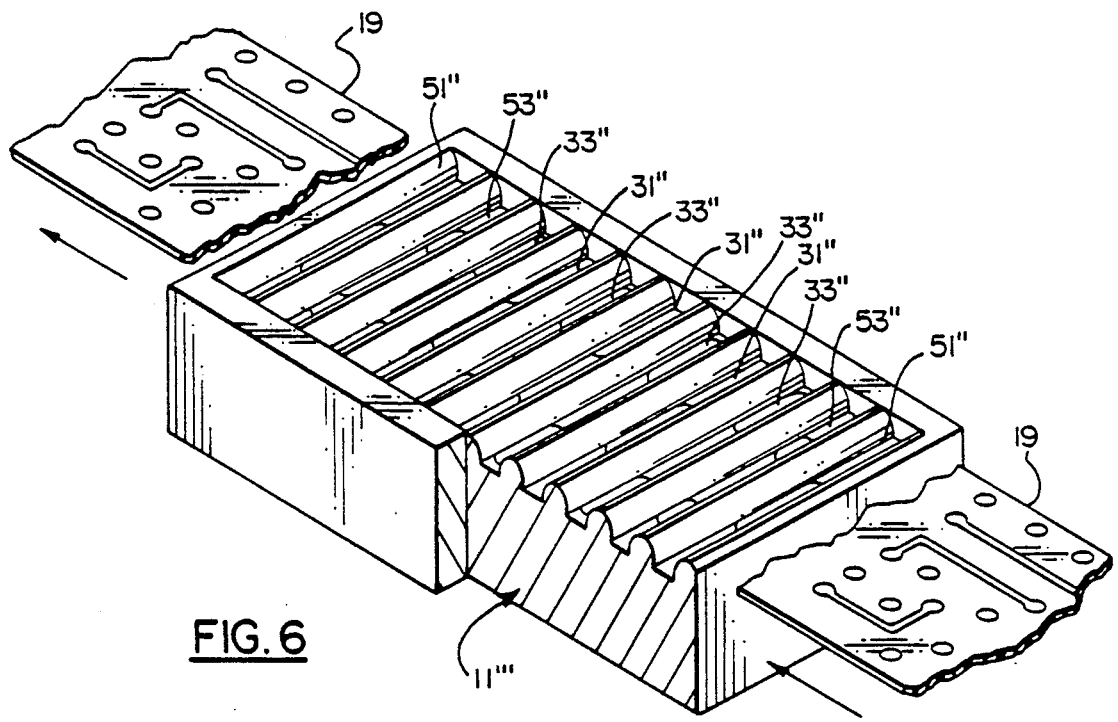
FIG. 6 is a perspective view of a head member capable of being used in the invention, in accordance with an alternate embodiment thereof.

In FIG. 6, there is shown a head member 11''' in accordance with yet another embodiment of the invention. In this embodiment, each of the respective inlet and outlet ports for the fluids being passed through the head member are of substantially longitudinal orientation and arranged substantially parallel to one another within the head's upper surface. Specifically, inlet ports for the desired second fluids (e.g., air) are represented by the numeral 51'' while the adjacent outlet ports for this means for supplying the second fluid are represented by the numerals 53''. The inlet and outlet ports (three inlet and four outlet) for the head's first fluids are illustrated by the numerals 31'' and 33'', respectively, and arranged in the alternating manner shown. Although not illustrated, head member 11''' may include supply passages and common chambers substantially similar to those for head members 11 and 11'' in FIG. 2, as well as common manifold members such as illustrated in FIG. 3. Head member 11''' may thus readily substitute for one (or both) of the head members depicted in FIGS. 1–3.

Figure 7:
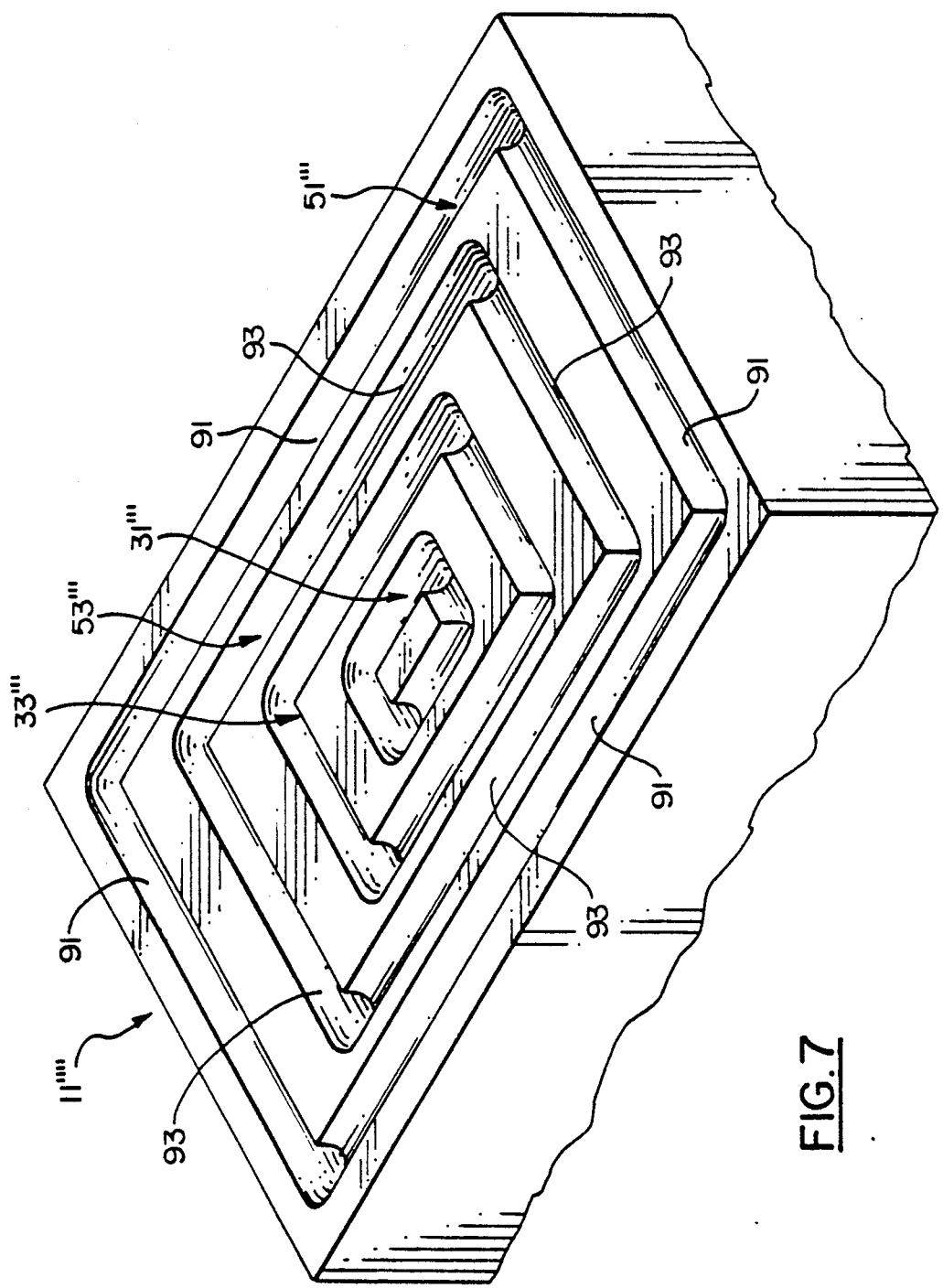
FIG. 7 is a partial perspective view of a head member in accordance with yet another embodiment of the invention.

In the embodiment of FIG. 7, a head member 11'''' in accordance with yet a further embodiment of the invention is shown. Head member 11'''', like the previous head members described herein, may be used within device 10 as one or both of the head members for treating the desired substrate. Head member 11'''', as shown in FIG. 7, provides a unique ability to substantially localize the area of impingement of the first fluid on the respective substrate surface (e.g. at a central location thereon). To achieve this, a longitudinal inlet port 51''' for the second fluid (e.g., air) is provided preferably in the form of an elongated channel 91 extending about the outer periphery of the head member's upper surface. Located internally thereof, and thus substantially surrounded by the elongated port 51''', is the outlet port 53''' for the means directing the second fluid, this outlet port also preferably in the form of an elongated channel 93. The outer channel 91 may be supplied by a series of narrow passages and common chambers such as described for the head members in FIG. 2, these not being shown in FIG. 7.

One or more outlet drains or the like (not shown) may be provided for the outlet channel 93 to provide means for withdrawal of the second fluid (including providing said fluid to a common manifold or the like such as used in the above embodiment of the invention depicted in FIG. 1–3). Also located within the upper surface of head 11'''' is the first means for supplying the first fluid (e.g., etchant), this means comprising an inlet port 31''' and adjacent outlet port 33''', which outlet port substantially surrounds the inlet port and thus assures the aforementioned localized impingement of fluid to the adjacent substrate. Preferably, each of the inlet and outlet ports 31''' and 33''' is in the form of an elongated channel, which in turn may be coupled to common chambers and respective passages similar to those used in the embodiment depicted in FIG. 2. Incoming first fluid is thus passed through the inlet port 31''' and outwardly through the adjacent, surrounding outlet port 33''', the adjacent exhausting first fluid restricting the first fluid to the precise, substantially rectangular location desired. Such a location of intersection between both fluids is thus understood to occur at a designated location between the respective elongated channels for the two outlet ports 53''' and 33'''.

Thus there has been shown and described a fluid treatment device possessing the several highly advantageous features cited above. As stated, the device is readily adaptable for use with a variety of fluids, including etchants, caustic solutions, water, air, etc. The device as described is of relatively simple construction and can thus be produced at relatively minor costs. Further, the device as described is readily adaptable for use in mass production, thereby even further reducing the cost of manufacture associated therewith.

While there have been shown and described what are at present considered the preferred embodiments of the invention, it will be obvious to those skilled in the art that various changes and modifications may be made therein without departing from the scope of the invention as defined by the appended claims. For example, it is possible, with minor modification, to use the invention for such processes as plating. This could be readily accomplished by placement of suitable electrodes within one/both of the head members at strategic locations relative to the location of the substrate to receive such plating. It is also possible to incorporate various means (e.g., heating elements) within the head member(s) (e.g., near the upper surface) if it is desired to raise the fluid temperature to a specified level. Further, mechanical motion devices (e.g., vibrators) may be employed to impart motion to the head members, if desired. Such motion may prove to increase speed and uniformity. Still further, various sensing devices (e.g., thermal, sonic) may be incorporated within the invention's head member(s) to monitor selected activities near the head's surface. Finally, it is also possible to combine various fluids (e.g., to provide special chemical properties) and pass these through each/both of the fluid directing means of the invention.

We claim:

1. A device for applying fluid to a substrate comprising first and second movable head members located substantially adjacent each other and adapted for having said substrate located substantially therebetween, each of said head members including therein means for directing a first fluid at an established first pressure against a first, predetermined location on said substrate and means for directing a second fluid at an established second pressure against a second, predetermined location on said substrate adjacent said first location to substantially limit said first fluid to impingement substantially only on said first location and define a precise line of demarcation between said first and second fluids, said established pressure of said second fluid substantially equal to or greater than said first pressure at the location of intersection between said first and second fluids, each of said head members directing said first and second fluids therefrom onto opposite surfaces of said substrate to maintain said substrate at a spaced location from each of said head members during application of said fluid, and means for permitting said first and second head members to move in substantially opposing directions relative to each other during said fluid application so as to enable said substrate to be maintained at said spaced location therebetween.

2. The device according to claim 1 wherein said means for directing said first fluid comprises at least one inlet port positioned within said head member and at least one outlet port positioned within said head member relative to said inlet port.

3. The device according to claim 2 wherein said means for directing said second fluid comprises at least one inlet port positioned within said head member and at least one outlet port positioned within said head member relative to said inlet port of said means for directing said second fluid and said outlet port of said means for directing said first fluid.

4. The device according to claim 3 wherein said means for directing said first fluid comprises a plurality of said inlet ports, said plurality of said inlet ports being oriented in said head member in a predetermined array.

5. The device according to claim 4 wherein said means for directing said first fluid comprises a plurality of said outlet ports, said plurality of said outlet ports being oriented in said head member in a preestablished array.

6. The device according to claim 5 wherein each of said plurality of said inlet ports of said means for directing said first fluid includes curvilinear side walls and each of said plurality of said outlet ports of said first means for directing said first fluid includes substantially linear side walls.

7. The device according to claim 3 wherein said means for directing said second fluid comprises a plurality of said inlet ports, said plurality of said inlet ports being oriented in said head member in a predetermined array.

8. The device according to claim 7 wherein said means for directing said second fluid comprises a plurality of said outlet ports, said plurality of said outlet ports being oriented in said head member in a preestablished array.

9. The device according to claim 8 wherein each of said plurality of said inlet ports and said outlet ports of said means for directing said second fluid includes substantially linear side walls.

10. The device according to claim 3 wherein said inlet port of said means for directing said second fluid substantially surrounds said outlet port of said means for directing said second fluid within said head member.

11. The device according to claim 10 wherein said inlet port of said means for directing said second fluid also substantially surrounds both of said inlet and outlet ports of said means for directing said first fluid.

12. The device according to claim 1 wherein said first fluid is a liquid and said second fluid is a gas.

13. The device according to claim 12 wherein said first fluid is an etchant solution and said second fluid is air.

14. The device according to claim 13 wherein said etchant solution of said first fluid is selected from the group consisting of cupric chloride, ferric chloride, potassium permangenate, sodium persulfate and nitric acid.

15. The device according to claim 1 wherein said means for permitting said first and second head members to move in substantially opposing directions relative to each other during said fluid application comprises first and second support members connected to said first and second head members, respectively, and first and second bendable members interconnecting said first and second support members.

16. The device according to claim 15 wherein each of said support members comprises a manifold.

17. The device according to claim 15 wherein each of said bendable members comprises a plate member.

* * * * *